United States Patent [19]
Mukai

[11] Patent Number: 5,358,736
[45] Date of Patent: Oct. 25, 1994

[54] METHOD OF FORMING A THIN AND CONTINUOUS FILM OF CONDUCTIVE MATERIAL

[75] Inventor: Ryoichi Mukai, Kawasaki, Japan

[73] Assignee: Fujitsu Limited, Kawasaki, Japan

[21] Appl. No.: 115,051

[22] Filed: Sep. 1, 1993

Related U.S. Application Data

[63] Continuation-in-part of Ser. No. 34,671, Mar. 19, 1993, abandoned.

[30] Foreign Application Priority Data

Mar. 19, 1992 [JP] Japan ................................ 4-063611
Jun. 30, 1992 [JP] Japan ................................ 4-172928
Sep. 2, 1992 [JP] Japan ................................ 4-234797

[51] Int. Cl.⁵ .......................... C23C 14/00; B05D 5/12
[52] U.S. Cl. ................................ 427/124; 427/123; 427/250; 427/405; 427/404
[58] Field of Search ............... 427/124, 123, 250, 405, 427/404

[56] References Cited

U.S. PATENT DOCUMENTS 4,828,870 5/1989 Ando et al. ................ 427/124

FOREIGN PATENT DOCUMENTS 3-240945 10/1991 Japan.

*Primary Examiner*—Roy V. King
*Attorney, Agent, or Firm*—Armstrong, Westerman, Hattori, McLeland & Naughton

[57] ABSTRACT

Stable nuclei of a conductive material are formed on a substrate in a first PVD process either by the adsorption of a nucleus forming gas onto the substrane surface and the subsequent deposition of the conductive material, or by the deposition of the conductive material at a partial pressure of a nucleus forming gas of less than $10^{-8}$ Torr, and afterward, a thin and continuous film of the conductive material is formed in a second PVD process. The substrate temperature is controlled so as not to exceed room temperature in the first PVD process, and so as to substantially exceed room temperature in a second PVD process. A thin and continuous film of a conductive material is also obtained by interrupting the deposition of the conductive material on a substrate provided with via-holes of small size by a PVD process, annealing the deposit, and then re-depositing the conductive material to obtain a continuous film. The annealing advantageously eliminates an overhang configuration formed at the opening of the via-hole, which otherwise prevents the deposited atoms from entering the via-hole, to thereby allow a continuous film to be formed within the small via-hole.

26 Claims, 7 Drawing Sheets

METHOD OF FORMING A THIN AND CONTINUOUS FILM OF CONDUCTIVE MATERIAL

This application is a continuation-in-part of U.S. patent application Ser. No. 08/034,671, filed on Mar. 19, 1993.

BACKGROUND OF THE INVENTION

1. Field of the Invention

The invention relates to a method of forming a film of a conductive material that is used for an interconnection layer in a semiconductor device.

2. Description of the Related Art

A conductive material such as aluminum is generally used for an interconnection material in a semiconductor device, and a physical vapor deposition (PVD) process, such as sputtering or evaporation, is used for the formation of an interconnection of conductive material in a semiconductor device. It is usual to form such an interconnection of conductive material in a one-step process.

In recently developed semiconductor devices, which have a multi-layer interconnection construction and a progressively refined structure, thinner interconnection layers are required because it is necessary to reduce the level difference between uneven surfaces and facilitate etching during a patterning operation. Even under such circumstances, the film of a formed interconnection layer should be in a continuous state to ensure electrical continuity therethrough.

When a film of a conductive material, such as aluminum, used for an interconnection layer in a semiconductor device is deposited on a substrate by a PVD process, the amount of the conductive material deposited on surfaces having a certain angle to the horizontal plane of the substrate, particularly the side walls of via-holes that are opened in an insulating film and have a wall surface perpendicular to the horizontal plane of the substrate, becomes smaller compared with the amount of conductive material deposited on horizontal surfaces, such as the top surface of the insulating film and the bottom surfaces of the via-holes. For example, on a side wall of a via-hole, the amount of deposited material is experimentally determined to be in the order of a quarter of that deposited on the top surface of an insulating layer and the bottom surface of the via-hole. Consequently, the thickness of the material deposited on the side walls of the via-holes is different from the thickness of the material deposited on the top surface of the insulating layer and the bottom surfaces of the via-holes.

A film of a metallic conductive material such as aluminum is grown in a nucleus growth mode during the deposition by a PVD process. In this nucleus growth mode, atoms of a material to be deposited, such as aluminum, that have been emitted into a vacuum, first reach the surface of a substrate, release thermal energy while migrating thereon, and then form smaller nuclei. The preferential sites for forming the nuclei are provided by atoms of gas adsorbed on the surface of the substrate and lattice defects. When atoms in excess of a critical number agglomerate around the nucleus, these atoms form a larger, stable nucleus. The stable nuclei subsequently consolidate with each other like droplets, and when the deposition proceeds further, a network state occurs, and eventually a continuous film on the substrate is formed. Thus, the continuous film is not formed when the deposition is terminated in spite of a lack of depositing material atoms.

In the situation of increasing development of thinner interconnection layers, films formed on the side walls of via-holes are prone to be discontinuous, particularly when the deposition of a conductive material is finished when there is a lack of atoms deposited on the side walls of the via-holes, on which the deposited film in particular tends to be quite thin. Also in regions other than via-holes, the formed film can be in a network state, or it can have a violently rough surface even if it is continuous, causing problems with the patterning of the film.

Few techniques for forming a film of a conductive material used for an interconnection layer in a multi-layer semiconductor device using two step physical vapor deposition of the material are known in the art.

JP3-240945(A) discloses the formation of a metallic film used for a conducting layer on a substrate by an evaporation or sputtering process in a two-step manner. In the first step, a metallic material is deposited at a substrate temperature not greater than one third of the melting temperature, expressed in absolute temperature, of the deposited material, until a relatively thin film having full or nearly full continuity in the texture thereof is formed (said continuity is represented as "structure with no openings (or gaps)" in the document), and in the second step, the material is deposited onto the film previously formed at a substrate temperature not lower than one half of the melting temperature, expressed in absolute temperature, of the deposited material. Thus, the film initially deposited on a substrate according to the method disclosed in JP3-240945(A) already has full or nearly full continuity.

Further, to the applicant's knowledge, it is not known to interpose an annealing operation in the course of the formation of a continuous film of a conductive material by a PVD process, as in the present invention.

SUMMARY OF THE INVENTION

It is an object of the invention to provide a method of forming a thin film of a conductive material by a PVD process, in which a continuous film having a relatively smooth surface can be formed on the whole depositing surface.

To achieve a thin and continuous film, it is preferable that the density of stable nuclei be increased at the nucleus formation stage in a film growing process, and the droplet-like consolidation is facilitated at the subsequent stage in the growing process. However, the conditions for increasing the density of stable nuclei and facilitating the droplet-like consolidation of the stable nuclei are different from each other. Accordingly, it is very difficult to obtain a thin and continuous film of a conductive material by a PVD process operating in a one-step manner, i.e., in the same condition throughout a deposition process, as in the conventional art.

The inventor has studied the formation of a thin and continuous film of a conductive material by a PVD process using two separate conditions; one of which is for producing dense, stable nuclei at the initial stage of the film growing process, and the other is for facilitating the droplet-like consolidation of the stable nuclei at the subsequent stage. Consequently, the inventor has experimentally found that it is effective for producing dense, stable nuclei to carry out the deposition of the conductive material at a substrate temperature of not greater than room temperature, and it is effective for film growth associated with droplet-like consolidation to perform the deposition at a substrate temperature sufficient to provide enough energy for the growth of an island structure and the consolidation of the said island of the deposited material, thereby forming a continuous film. It has also been found that a certain gas species is particularly efficacious for forming stable nuclei in a high density.

Thus, in one aspect of the present invention, it provides a method of forming a thin and continuous film of a conductive material on a substrate by a PVD process, the method comprising: (a) placing a substrate into a vacuum chamber of a PVD system, and creating a vacuum; (b) introducing a nucleus forming gas into the vacuum chamber and allowing the atoms of the gas to be adsorbed on the surface of the substrate, while holding the substrate at a temperature not exceeding room temperature; (c) stopping the introduction of the gas and re-creating a vacuum, and carrying out a first physical vapor deposition of a conductive material at a temperature of the substrate not exceeding room temperature until stable nuclei of the conductive material are formed on the substrate; and (d) heating the substrate and carrying out a second physical vapor deposition of the conductive material, wherein the temperature to which the substrate is heated is a substantially higher temperature than room temperature, thereby forming a thin and continuous film of the conductive material on the substrate.

It has been experimentally verified that when the pressure in the vacuum chamber is less than $10^{-8}$ Torr in step (a), the effect of the invention is more clearly observed. Also, it is advantageous to carry out both the first and second deposition processes in a vacuum of a pressure of less than $10^{-7}$ Torr or in a vacuum atmosphere in which a non-nucleus forming gas is included; or to carry out one of the first and second deposition processes in the vacuum of less than $10^{-7}$ Torr and the other in a vacuum atmosphere in which a non-nucleus forming gas is included. The non-nucleus forming gas is preferably selected from the group consisting of argon, krypton, xenon, helium, and neon. Furthermore, it is also advantageous that a step be added to degas the substrate by baking it in a high vacuum atmosphere prior to adsorption of the atoms of the nucleus forming gas onto the substrate.

The invention further provides, in another aspect thereof, a method of forming a thin and continuous film of a conductive material on a substrate by a PVD process, the method comprising: (a) placing a substrate into a vacuum chamber of a PVD system, and creating a vacuum having a partial pressure of a nucleus forming gas of less than $10^{-8}$ Torr; (b) carrying out a first physical vapor deposition of a conductive material at a substrate temperature not exceeding room temperature, until stable nuclei of the conductive material are formed on the substrate; and (c) heating the substrate and carrying out a second physical vapor deposition of the conductive material, wherein the temperature to which the substrate is heated is a substantially higher temperature than room temperature, while maintaining the vacuum in the chamber, thereby forming a thin and continuous film of the conductive material on the substrate.

Formation of a continuous conductive film in a via-hole can be prevented by an overhang formed at the top of the via-hole, i.e., the opening of the via-hole, during the deposition of the conductive film material, particularly when the via-hole has a small opening, such as 0.5 micrometers or less. The overhang at the opening of the via-hole prevents depositing atoms of the conductive material from passing the opening and reaching the sites in the via-hole where the atoms are to be deposited, and thus causes formation of discontinuous film in the via-hole due to lack of depositing atoms. The formation of overhang is related in part to the incident angle of depositing atoms entering the via-hole. At least part of the depositing atoms supplied from a source thereof commonly have certain incident angles which are not parallel to the axial direction of the via-hole (i.e., the direction perpendicular to the bottom of the via-hole), and which are caused by the collision of depositing atoms with each other and/or with atoms or molecules of gas remaining in a deposition atmosphere. The depositing atoms having oblique incident angles are responsible for the formation and occurring of the overhang at the opening of the via-hole.

The present invention further provides a method of forming a thin and continuous conductive film, in which the effect of the overhang at the opening of a via-hole is eliminated or at least significantly reduced. Thus, in a further aspect of the present invention, there is provided a method of forming a thin and continuous film of a conductive material, by a PVD process, on a substrate having an insulating film which is provided with via-holes, the method comprising: (a) placing a substrate into a vacuum chamber of a PVD system, and creating a vacuum therein; (b) depositing a conductive material onto the substrate at a certain temperature: (c) interrupting the deposition of the conductive material; (d) annealing the deposited conductive material with the substrate at a higher temperature than the temperature for the deposition thereof and under a vacuum condition; and (e) re-depositing the conductive material onto the annealed substrate.

The term "continuous film" as used herein means such a film as a fully deposited conductive film on the walls and bottom of a via-hole.

DESCRIPTION OF THE PREFERRED EMBODIMENTS

Figure 1A:
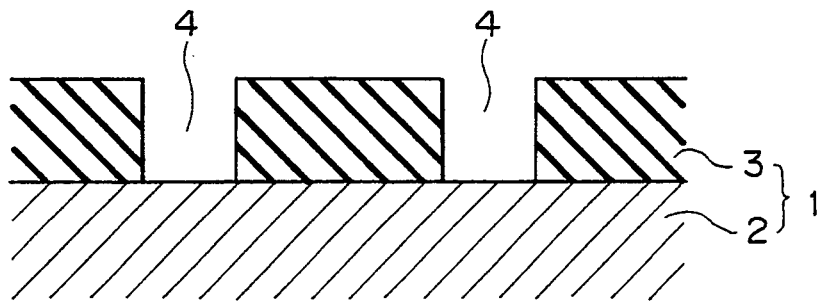
FIGS. 1A, 1B, 1C and 1D schematically show a process for the formation of a thin aluminum film according to an embodiment of the invention.

In embodiments of the invention in which different temperatures are employed for the first and second depositions of a conductive material, a certain gas species is used to form stable nuclei in a high density on a substrate, at the initial stage of the deposition of a conductive material. The preferable gas used in the invention is oxygen or a gas of an oxygen-containing compound, such as water ($H_2O$) or carbon monoxide (CO). A mixture of these gases may be used. Although carbon monoxide as the oxygen-containing compound has proved to be effective for the formation of stable nuclei, carbon dioxide ($CO_2$) appears to be less effective.

These nucleus forming gases successfully serve to provide a large number of nucleation sites for forming separate stable nuclei on a substrate. In one embodiment of the invention, the atoms of the gas are previously adsorbed onto a substrate at a temperature of the substrate not exceeding room temperature to provide nucleation sites, and the atoms of a conductive material are then supplied and deposited onto the substrate. The deposited atoms subsequently form smaller, initial nuclei at the nucleation sites, and then grow into larger, stable nuclei. At this time, the supply and deposition of the gas atoms is discontinued.

In the other embodiment of the invention, the atoms of the gas are present at a partial pressure of less than $10^{-8}$ Torr, in a vacuum chamber for depositing a conductive material, during the deposition of the conductive material. The atoms of the gas and the conductive material are combined in the vapor phase to produce a large number of separate groups consisting of both atoms, and then deposited onto a substrate to form stable nuclei thereon. Subsequently, the deposition is discontinued. If the nucleus forming gas is present at a partial pressure of more than $10^{-8}$ Torr, the resultant film of the deposited material has a high resistivity. An inert gas as a non-nucleus forming gas, such as helium, neon, argon, krypton, and xenon, may be present unless the partial pressure of the nucleus forming gas exceeds $10^{-8}$ Torr.

In both cases of the embodiment, a substrate should be maintained at a temperature not exceeding room temperature during the first deposition of a conductive material in order to form stable nuclei in a high density. The term "room temperature" used herein generally means a temperature of 30° C. The temperature used for the formation of stable nuclei is preferably not greater than 20° C., and more preferably not greater than 5° C. Although a much lower temperature, e.g., the liquid nitrogen temperature, may be employed, the lower the temperature, the more the gas is adsorbed on the substrate, which results in the degradation of the characteristics of the resultant device, and the greater the required energy for heating the substrate to a temperature used at the subsequent deposition. The inventor favorably used a substrate temperature of 0° C. during the first deposition of a conductive material to form stable nuclei, as shown in the Examples below.

Subsequent to the finish of the formation of stable nuclei, the substrate is heated in a vacuum to a substantially higher temperature than room temperature, so as to provide sufficient energy to allow the formed stable nuclei to grow into larger islands of the deposited material by migration thereof during a second deposition, and further allowing the islands to consolidate with each other. The conductive material is then deposited onto the substrate. The atoms of the deposited material are provided with energy from the heated substrate, and then migrate on the substrate to form an island together with the stable nuclei. As the material is further deposited, the islands thus formed are grown so as to consolidate with each other, and eventually provide a continuous film having a relatively smoother surface. Thus, the said substantially higher temperature than room temperature is a temperature allowing such droplet-like consolidation to occur, as described above. A "substantially higher temperature than room temperature", means that the temperature is more or less increased from room temperature by heating. At a lower temperature, since sufficient energy may not be provided, definite boundaries between the grown and consolidated islands will be found in the resultant film, which is unfavorable. During the second physical vapor deposition in the method of the invention, it is preferable that the substrate temperature be 80° C. or more, more preferably 90° C. or more, and most preferably 100° C. or more. Practically speaking, the substrate may be heated to the melting temperature of the conductive material to be deposited during the second deposition, and although the substrate may be heated beyond the melting temperature to the vaporizing temperature of the deposited material, heating to such a high temperature consumes much more energy and is not advantageous.

A nucleus forming gas, particularly a gas having an oxidizing property such as oxygen or water, often causes degradation of the characteristics of a produced device if it is present in an excess amount. Therefore, as disclosed hereinbefore, in the case of atoms of a nucleus forming gas being adsorbed on a substrate prior to a first deposition of a conductive material, it is advantageous that both the first and second deposition processes are carried out in a vacuum having a pressure lower than $10^{-7}$ Torr or in a vacuum atmosphere in which a non-nucleus forming gas, e.g., argon gas, is included; or one of the first and second deposition processes is carried out in a vacuum of lower than $10^{-7}$ Tort and the other in a vacuum atmosphere in which a non-nucleus forming gas is included. Also in the case of atoms of a conductive material being deposited on a substrate together with atoms of a nucleus forming gas in a first deposition, it is advantageous to carry out second deposition in a vacuum having a pressure lower than $10^{-7}$ Torr or in a vacuum atmosphere in which a non-nucleus forming gas, such as argon or helium, is included.

The finish of a first physical vapor deposition of a conductive material, i.e., the completion of the formation of stable nuclei can be readily detected using a means for measuring film thickness. For example, a quartz oscillator type measuring device can be advantageously used. Although the formation of stable nuclei varies depending upon conditions of deposition and conditions proper to a deposition system, the film thickness at the completion of the formation of stable nuclei can be easily determined by an experiment using a film thickness measuring device if such conditions are fixed.

For turning over a first deposition of a conductive material to a second deposition, the deposition of the material is discontinued after completion of the formation of stable nuclei, and a substrate is heated to a sufficient temperature while maintaining a vacuum in a vacuum chamber, after which the deposition of the material may be restarted. It is possible to initiate the second deposition after completion of the formation of stable nuclei on a substrate by moving the substrate onto a heater-block heated to a given temperature in advance, which is more advantageous as the operating time becomes shorter.

Another embodiment of the invention is directed to elimination of the overhang of a deposited conductive material at the opening of a via-hole, which is formed by the depositing atoms of the conductive material scattered by the collision of the atoms with each other and/or with atoms or molecules of gas remaining in a deposition atmosphere and obliquely arriving at the opening. To eliminate the overhang configuration, the deposit is annealed before the formation of a continuous film, by interrupting the deposition and increasing the temperature of the deposit to a temperature sufficient to allow the mass transportation and configuration change thereof to occur. In this embodiment, a rate of deposition of a conductive material is kept higher than a rate of migration of the deposited material during the deposition, in order to eventually form a continuous film having a smoother surface. The higher the deposition temperature, the more the migration occurs. It is therefore advantageous to carry out the deposition of a conductive material at a lower temperature. For the purpose of the present invention, the temperature at which the deposition is to be performed is lower than a temperature at which the deposit will be provided with a sufficient energy to be mass-transported on a substrate and will be able to change the configuration thereof. The latter temperature is hereinafter called a mass-transportation temperature. At any rate, unlike the above-described embodiments of the invention using different temperatures for first and second depositions, the present embodiment allows to use a relatively higher temperature, such as 100° C. or more, for the total deposition of conductive material. The annealing of the deposit is favorably carried out at the mass-transportation temperature of the material or more.

The mass-transportation temperature varies depending on different factors, such as a material to be deposited, and deposition conditions including a deposition process used, a depositing pressure, and constituent(s) of residual gas in a deposition atmosphere. For example, when aluminum is deposited using a conventional evaporation process, the deposit of aluminum would be mass-transported on a substrate above about 200° C. Deposit of aluminum obtained by a conventional sputtering process may be mass-transported above bout 500° C.

The elimination of overhang of deposit at the opening of a via-hole by interposed annealing represents the removal of an obstacle for depositing atoms to reach the inside of the via-hole, and permits depositing atoms to form a continuous film within the via-hole. Deposition and annealing may be repeated, as required, until the continuous film of deposited material is eventually formed in the via-hole.

The annealing after the interruption of deposition is required to be carried out continually in a vacuum without breaking the vacuum during the deposition. When the vacuum is broken after the deposition, an oxidative gas, which is included in a process atmosphere, is adsorbed on the surface of the deposit, and will prevent the surface migration of the deposit due to the oxidized material (e.g., alumina in the case of conductive material of aluminum) formed at the surface layer of the deposit. Such an oxidative gas is exemplified by oxygen ($O_2$) and water ($H_2O$). Thus, the annealing should be effected before the surface of the deposit is totally covered by the adsorbed oxidative gas included in the process atmosphere. Preferably, annealing is carried out in a vacuum containing an oxidative gas of partial pressure of not greater than $10^{-9}$ Torr.

It is also preferable for the deposition to be carried out in a vacuum pressure of not greater than $5 \times 10^{-7}$ Torr. The deposition in such a vacuum pressure allows the mean free path of deposition atoms to be long. Consequently, the probability of depositing atoms losing a kinetic energy by the collision with each other and/or with a residual gas molecule can be reduced, and the scattering of depositing atoms by such collisions can also be reduced. Thus, the amount of depositing atoms having incident angles, which are perpendicular or nearly perpendicular to the substrate surface, becomes larger, and accordingly, the amount of atoms arriving inside the via-hole is increased.

Furthermore, it has been found that use of a lower deposition pressure is advantageous to reduce the extent of blockage of the opening of a via-hole due to an overhang formed thereat in the course of deposition.

It would be appreciated that the deposition and annealing operations may be carried out under the same vacuum pressure or different vacuum pressures, provided that the switching from one operation to the other is carried out without breaking the vacuum condition.

The rate of mass transportation of deposit during the annealing depends on an annealing temperature as well as the amount of oxidative gas adsorbed on the surface of the deposit. Thus, the annealing is performed until the overhang at the opening of a via-hole is eliminated. The actual annealing time, i.e., the time actually required to eliminate the overhang, is usually much shorter than the time required for heating the deposit along with the substrate therefor to a given annealing temperature.

The present invention may suitably applied to the formation of a thin and continuous conductive film on a substrate provided with via-hole having an opening size of 0.5 micrometers or less.

A preferred PVD process used in the invention is evaporation. Additionally, sputtering may be employed.

Many conductive materials can be deposited on a substrate to form a thin and continuous film according to the invention. The conductive material includes metallic materials used in the manufacture of an interconnection layer in a semiconductor device, such as aluminum, copper, tungsten, titanium, tantalum, molybdenum, gold, and platinum. An alloy such as aluminum alloy may be used.

The following examples are provided so that those skilled in the art can better understand and appreciate the invention. These examples are for the purpose of illustration only and are not to be construed as limitations in the scope of the invention disclosed herein.

EXAMPLE 1

As shown in FIG. 1A, a substrate 1 was prepared by thermally oxidizing a surface of a silicon wafer (2) to form a silicon dioxide film (3) 1 micrometer in thickness, and patterning the film (3) using a conventional photolithography technique to open via-holes (4) $0.4 \times 0.4$ micrometers square.

Figure 1B:
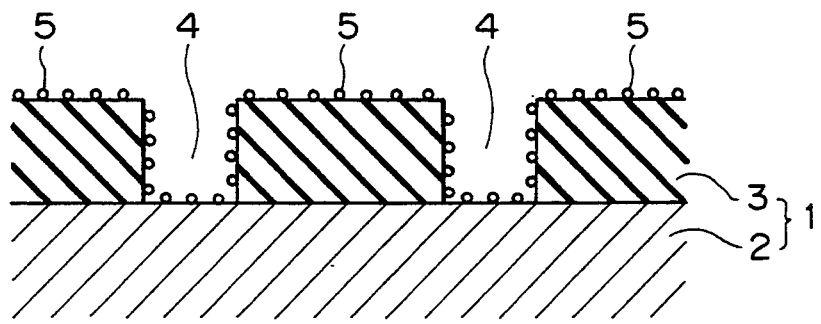

The substrate 1 was then placed into the vacuum chamber of an electron beam evaporation system provided with an electron gun, not shown. A vacuum was created in the vacuum chamber having a pressure of less than $10^{-10}$ Torr (a pressure not greater than $10^{-8}$ Torr may be advantageously used in the method of the invention), and oxygen gas was subsequently introduced into the chamber to increase the pressure in the chamber to $5 \times 10^{-5}$ Torr, thereby allowing the oxygen atoms 5 to be adsorbed onto the substrate 1, as shown in FIG. 1B. To enhance the adsorption of the gas, the temperature of the substrate was held at 0° C. during the adsorption. The adsorption was continued for 1 minute. In this adsorption process, the exposed surfaces of the silicon wafer 2 are not oxidized to the extent that the contact resistance, between the silicon wafer and an aluminum film that will subsequently be formed, is adversely increased.

Figure 1C:
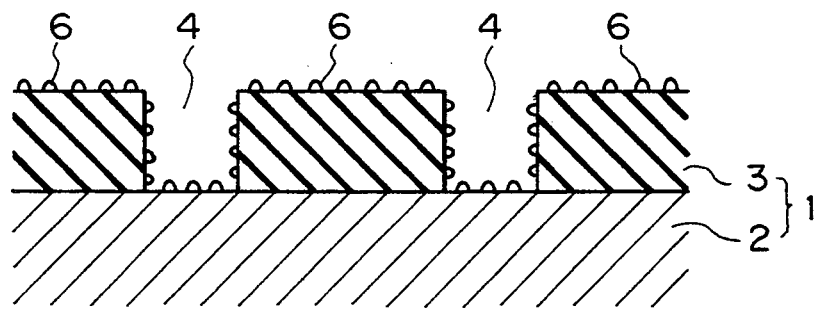

After the adsorption process, a first step of deposition was performed. Maintaining the temperature of the substrate at 0° C. the pressure in the vacuum chamber was reduced to $5 \times 10^{-8}$ Torr, and aluminum was evaporated onto the substrate 1 at a deposition rate of 4 angstroms per second, thereby forming a stable nuclei 6 of aluminum on the substrate 1 using the adsorbed oxygen atoms as nucleation sites, as shown in FIG. 1C. The measurement by a quartz oscillator type film thickness gauge showed a film thickness of 40 angstroms.

Figure 1D:
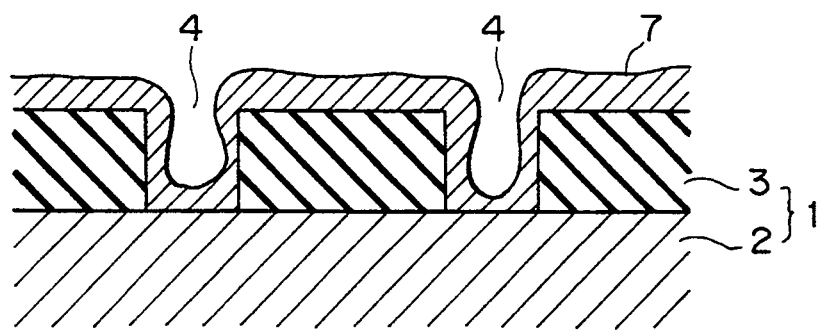

Subsequently, a second deposition step was carried out. A pressure of $10^{-10}$ Torr was created in the chamber, the substrate 1 was then heated to a temperature of 100° C., and aluminum was evaporated at a pressure of $10^{-5}$ Torr and at a deposition rate of 4 angstroms per second to form an aluminum film 7 having a thickness of 2000 angstroms on the substrate 1. As a result, the continuous film of aluminum was obtained on the side walls of via-holes 3 as well, as shown in FIG. 1D.

Comparative Example 1

An aluminum film having a thickness of 2000 angstroms was formed on a substrate prepared as in Example 1, by repeating only the first deposition step described in Example 1.

Figure 2:
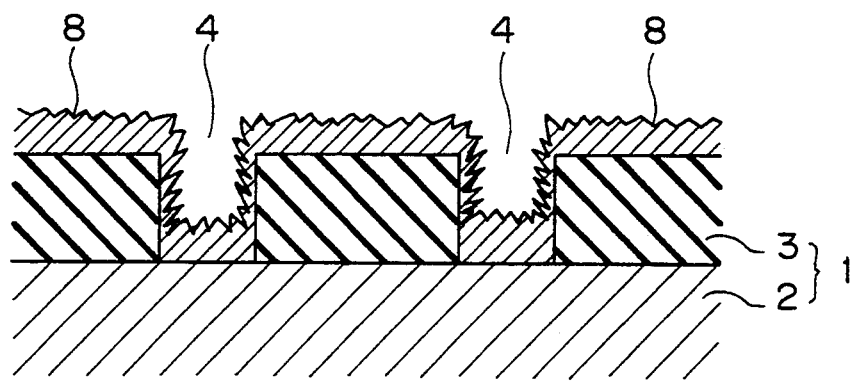
FIGS. 2 and 3 are illustrations of an aluminum film deposited under a constant condition throughout the deposition process, FIGS. 4A and 4B schematically show the formation of a thin aluminum film according to another embodiment of the invention.

In this case, the surface density of stable nuclei formed at the initial stage of the deposition process was in the order of $10^{15}/cm^2$. Nevertheless, as schematically shown in FIG. 2, the deposited film 8 consisted of needle-like crystal grains, because the droplet-like consolidation of the stable nuclei was restrained during the subsequent stage of the deposition process on account of the low temperature of the substrate 1. Particularly, the continuity of the film formed on the side walls of the via-holes 4 was broken, in which the quantity of deposited aluminum was relatively small.

Comparative Example 2

An aluminum film having a thickness of 2000 angstroms was formed on a substrate prepared as in Example 1, by carrying out only the second deposition step described in Example 1.

Figure 3:
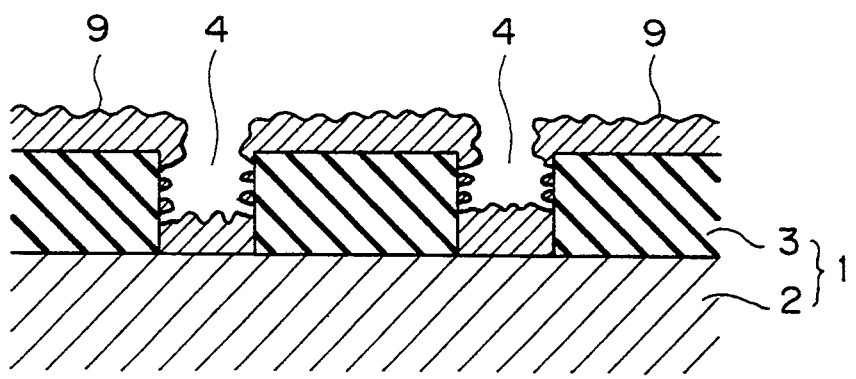

In this case, the surface density of stable nuclei formed at the initial stage of the deposition process was in the order of $10^{10}/cm^2$, which is lower than that obtained under the first step of the deposition process conditions because of the higher substrate temperature of 100° C. In the subsequent deposition stage, since the droplet-like consolidation of the stable nuclei vigorously took place in addition to the reduced surface density of stable nuclei, the stage of the islands of the deposited material coming into contact with each other was delayed. Consequently, as shown in FIG. 3, the island structure remained and the continuity of film was broken in the side walls of the via-holes 4, and the aluminum films 9 formed on the top surface of the insulating layer of silicon oxide 3 and the bottom of the via-hole 4 had a rougher surface.

Although the aluminum films 8 and 9 have an intense surface roughness in the region other than the side walls of the via-holes 4 in both Comparative Examples 1 and 2, the situations are different if compared in detail. The film 8 in Comparative Example 1 has a surface configuration with a sharpened roughness, whereas the film 9 in Comparative Example 2 shows a surface configuration having relatively dull or smooth undulations.

EXAMPLE 2

A substrate 1 similar to that used in Example 1, which consists of a silicon wafer 2 and an insulating film 3 formed by thermal oxidization of the surface of the silicon wafer, was placed in the vacuum chamber of the electron beam evaporation system used in Example 1. A pressure of less than $10^{-10}$ Torr was then created in the chamber.

In a first step of deposition, aluminum was deposited at substrate temperature of 0° C. and a pressure of $5 \times 10^{-8}$ Torr (the partial pressure of nucleus forming gas, such as $O_2$ and $H_2O$, was estimated to be $5 \times 10^{-9}$ Torr), and at a deposition rate of 4 angstroms per second, thereby forming stable nuclei. At the end of the deposition, a measurement by a quartz oscillator type thickness gauge indicated a film thickness of 40 angstroms.

Figure 4A:
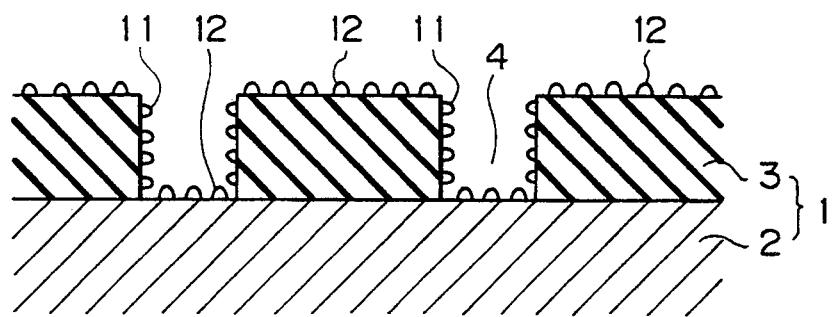

The formed stable nuclei of aluminum after completion of the first step of deposition is schematically shown in FIG. 4A. The stable nuclei of aluminum 11, 12 were formed in a high density on the exposed silicon wafer surfaces and the insulating film 3 of silicon oxide. The nuclei 11 formed on the side walls of the via-holes 4 were smaller than the nuclei 12 in regions other than the side walls of the via-holes.

Maintaining a vacuum in the chamber, a second deposition step was then carried out. In this second step, a pressure of less than $10^{-10}$ Torr was created in the chamber, the temperature of the substrate was then increased to 100° C., and aluminum was evaporated at $10^{-8}$ Torr and at a deposition rate of 4 angstroms per second to form an aluminum film having a thickness of 2000 angstroms.

Figure 4B:
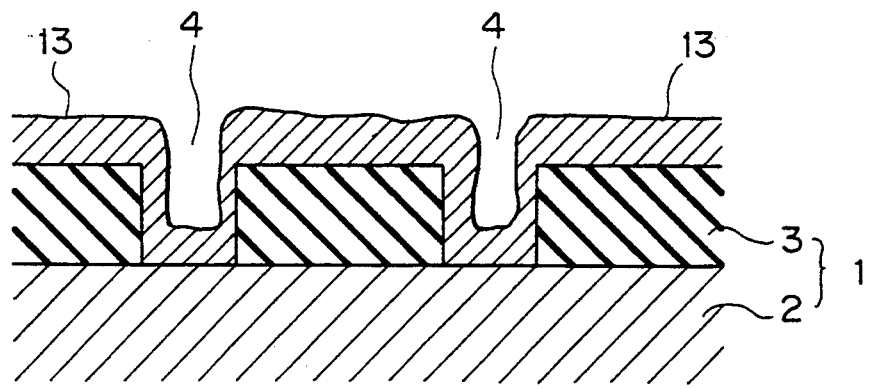

The resultant aluminum film 13 is schematically shown in FIG. 4B. The film 13 was also continuous on the side walls of the via-holes 4. The surface of the film 13 was smooth, as a whole.

EXAMPLE 3

The procedure of Example 2 was repeated except that an aluminum film having a thickness of 1000 angstroms was deposited at the second deposition step.

Also in this case, the formed aluminum film was also continuous on the side walls of the via-holes, and the film surface was smooth.

COMPARATIVE EXAMPLE 3

The conditions of the first deposition step in Example 2 were maintained until completion of the deposition of all of the aluminum, thereby allowing an aluminum film having a thickness of 2000 angstroms to be deposited on a substrate similar to that used in Example 2.

In this case, the deposited film consisted of needle-like crystal grains, as in Comparative Example 1, because the surface density of the stable nuclei formed at this initial stage of the deposition process was in the order of $10^{15}/cm^2$, but the droplet-like consolidation of the stable nuclei was restrained during the subsequent stage of the deposition process, as the substrate temperature was low. Particularly, the continuity of the film formed on the side walls of the via-holes was not obtained, in which the quantity of deposited aluminum was small.

Comparative Example 4

The conditions of the second deposition step in Example 2 were first established and maintained until completion of the deposition of all of the aluminum, thereby allowing an aluminum film having a thickness of 2000 angstroms to be deposited on a substrate.

In this case, the surface density of the stable nuclei formed at the initial stage of the deposition process was lowered to $10^{10}/cm^2$, which is lower than that obtained in the first deposition step in Example 3 because of the higher substrate temperature of 100° C. In the subsequent stage of deposition, since vigorous droplet-like consolidation of the stable nuclei occurred, in addition to the reduced surface density of the stable nuclei, the mutual contact stage of the islands was delayed. As a result, as in Comparative Example 2, the island structure remained and the film continuity was broken in the side walls of the via-holes, in which the quantity of deposited aluminum was relatively small, and the aluminum films formed in regions other than the side walls of the via-holes had a rougher surface.

As in the Comparative Examples 1 and 2, although the aluminum films in Comparative Examples 3 and 4 have an intense surface roughness in the region other than the side walls of the via-holes in both Comparative Examples 3 and 4, the situations are different if compared in detail. The aluminum film in Comparative Example 3, which has been formed using only the deposition conditions of the first deposition step in Example 2 has a surface configuration with increased roughness, whereas the film in Comparative Example 4, which has been made using only the deposition conditions of the second step of deposition in Example 2 has a surface configuration with relatively dull or smooth undulations.

As described above, according to the method of the invention, in which the deposition of a conductive material is not effected in a one-step process, as in conventional methods, to attain a given final thickness, but is effected by dividing the deposition process into first and second steps, in which the conductive material is first deposited while maintaining a substrate at a temperature not exceeding room temperature and is further deposited while maintaining the substrate a substantially higher temperature than room temperature, respectively, a thin and continuous film of conductive material having a smooth surface configuration can easily be formed to a thickness of as small as 1000 angstroms in the whole region of a substrate.

EXAMPLE 4

On a substrate 1 as used in Example 1, which consists of a silicon wafer 2 and an insulating film 3 of $SiO_2$ provided with via-holes 4, aluminum was deposited by evaporation. In this example, the via-holes 4 were 0.5×0.5 micrometers in opening size and 1 micrometer in depth. Prior to the evaporation, the pressure of vacuum chamber was lowered to $1 \times 10$ Torr. The evaporation was then carried out at a pressure of $1 \times 10^{-5}$ Torr (while adding argon gas) at a deposition rate of 200 angstroms per minute to obtain a film 4,000 angstroms thick. The temperature of the substrate was 150° C. during the evaporation. Another evaporation was carried out using the same procedure, except that the deposition pressure was $1 \times 10^{-7}$ Torr in this time.

Figure 5A:
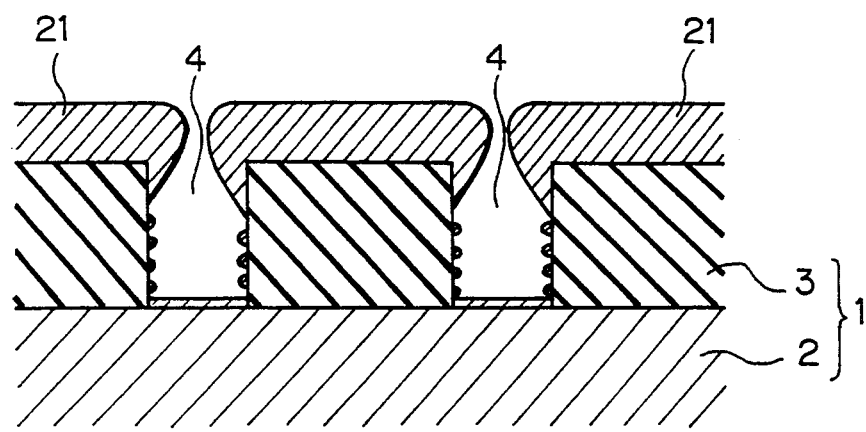
FIGS. 5A and 5B illustrate a comparison between aluminum films formed at a higher vacuum pressure and a lower vacuum pressure.
Figure 5B:
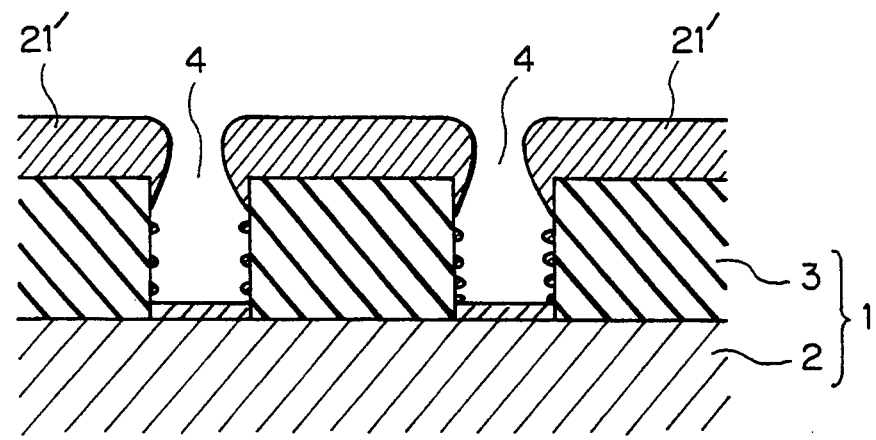

The resultant film 21 formed at a higher pressure of $1 \times 10^{-5}$ Torr and the other film 21' formed at a lower pressure of $1 \times 10^{-7}$ Torr, are schematically shown in FIGS. 5A and 5B, respectively. As can be seen, by the deposition at a lower pressure, the extent of blockage of the opening of via-hole due to the formed overhang configuration is reduced, and the amount of deposit at the bottom of the via-hole is increased, as compared with the deposition at a higher pressure.

It should be noted that although FIGS. 5A and 5B illustrate planar surfaces of the films formed by the deposit on the insulating films 3 for simplification, the actual films have any undulation in the surface thereof, as illustrated FIGS. 1D and 4B. The same is true of FIGS. 6A and 6B, and 7A and 7D, which are referred to hereinafter.

EXAMPLE 5

This example illustrates annealing according to the invention.

Using the same substrate and procedure as described in Example 4, aluminum was evaporated at a deposition pressure of $1 \times 10^{-7}$ Torr onto the substrate to a film thickness of 2,000 angstroms. Annealing was carried out immediately after the deposition (within 1 minute after the deposition), while keeping a vacuum condition of $1 \times 10^{-8}$ Torr. For the annealing, the substrate was heated to 200° C. for 5 minutes.

Figure 6A:
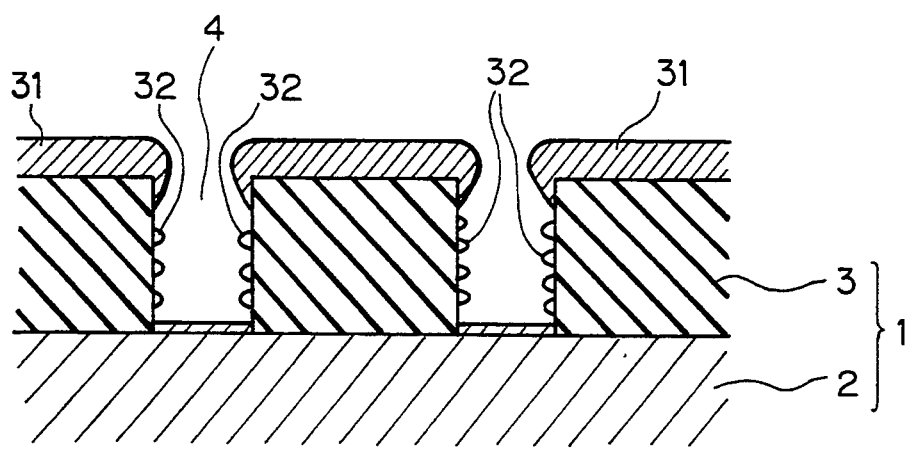
FIGS. 6A and 6B illustrate aluminum films before and after annealing.
Figure 6B:
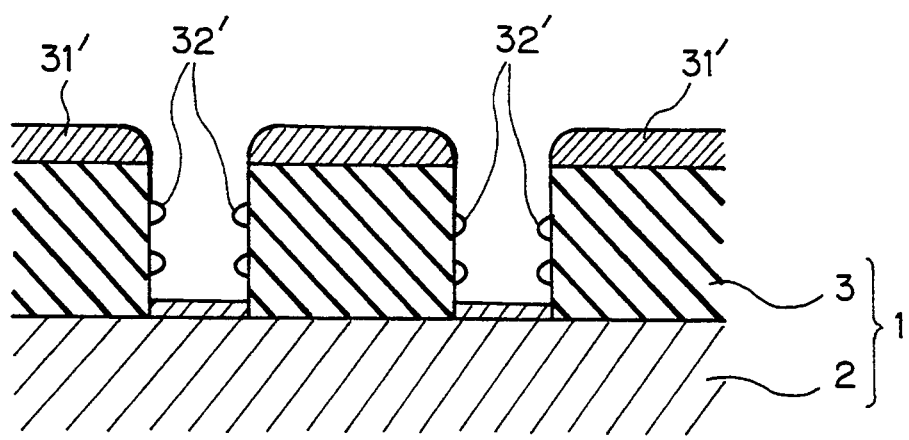

FIGS. 6A and 6B schematically show the formed aluminum films 31 and 31' before and after the annealing, respectively. As can be seen, by the annealing, the overhang configuration was eliminated, and islands 32 of aluminum deposited on the walls of the via-hole agglomerated into larger islands 32'.

EXAMPLE 6

This example illustrates the formation of a continuous film of aluminum on a substrate, provided with via-holes having a small opening size of 0.5×0.5 micrometers, by repeating deposition and annealing.

Figure 7A:
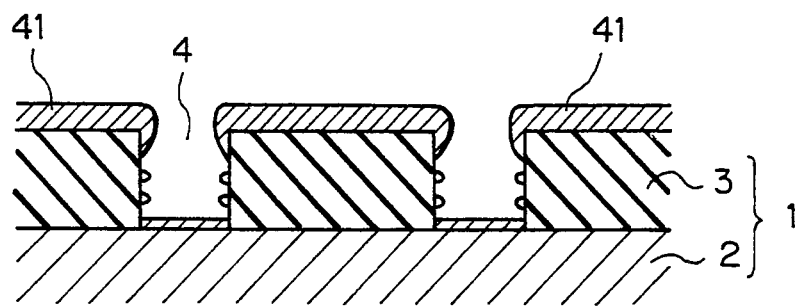
FIGS. 7A, 7B, 7C and 7D schematically show the formation of a thin and continuous aluminum film by the insertion of annealing in the course of deposition of aluminum material.
Figure 7B:
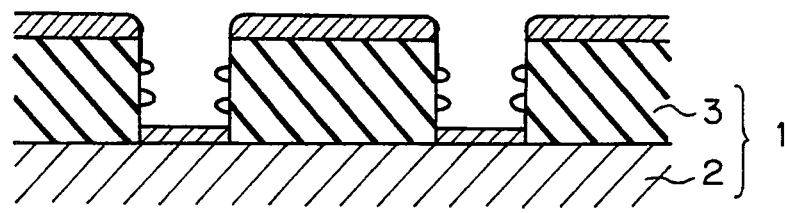
Figure 7C:
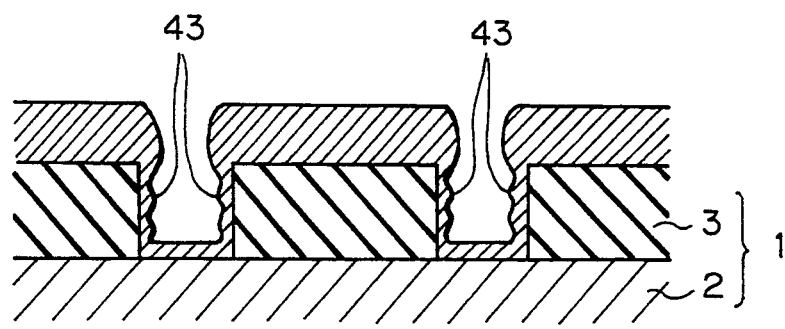
Figure 7D:
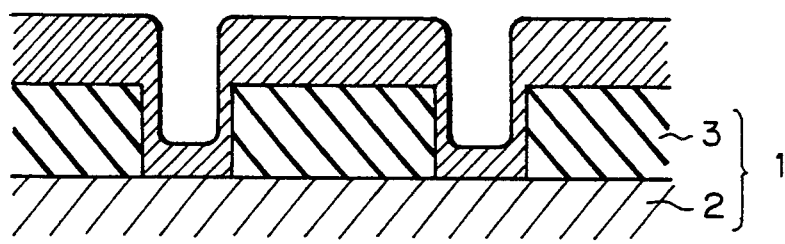

Respective deposition of aluminum ($1 \times 10^{-7}$ Torr, 150° C.) and annealing ($1 \times 10^{-8}$ Torr, 200° C. and 5 minutes), as described in Examples 4 and 5, were repeated as follows: First, aluminum was deposited on a substrate 1 consisting of a silicon wafer 2 and an $SiO_2$ film 3, and provided with via-holes 4, to form a film 41 having a thickness of 2,000 angstroms and an overhang configuration at the opening of the via-hole, as schematically shown in FIG. 7A. The formed film was then annealed to thereby eliminate the overhang configuration, as shown in FIG. 7B. (These steps were the same as those in Example 5.) Subsequently, aluminum was further deposited to a thickness of 2,000 angstroms. In this stage, although aluminum deposited on the walls of the via-hole 4 provided a continuous film 43, the morphology of the surface of the film 43 was very poor, as shown in FIG. 7C. Thereafter, a second annealing was performed. By this second annealing, the poor morphology was substantially improved, as shown in FIG. 7D.

Of course, these steps proceeded without breaking vacuum conditions.

Comparative Example 5

Aluminum was deposited on a substrate 1 as used in the preceding examples without interposing annealing of a formed film. The deposition was carried out at a temperature of 200° C., i.e., a temperature equivalent to the annealing temperature in the preceding examples, until a film of 4,000 angstroms was obtained.

Figure 8:
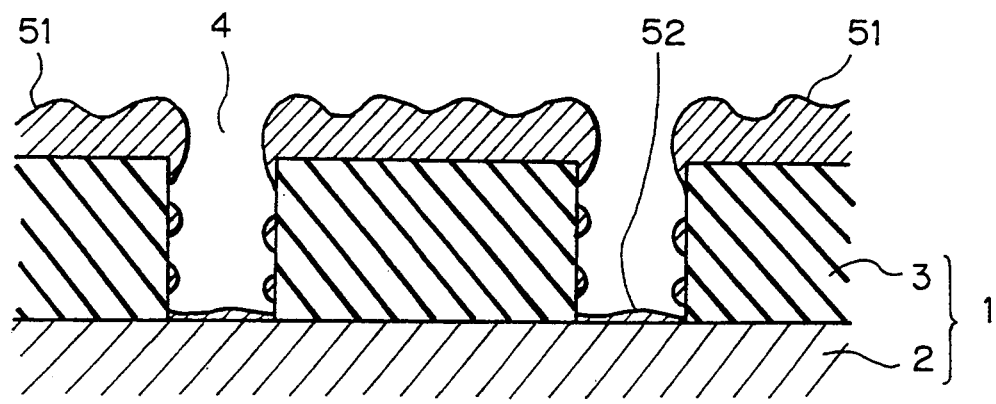
FIG. 8 illustrates an aluminum film formed by evaporation at a relatively higher temperature without interposing annealing.

In this case, as schematically shown in FIG. 8, the resultant aluminum film 51 formed on the insulating film 3 and the film 52 formed at the bottom of the via-hole 4 showed poor morphology. Further, on the walls of the via-hole, the deposit did not provide a continuous film but an island structure.

As described above, according to the method of the invention, in which annealing is interposed in the course of the formation of a thin and continuous film of a conductive material by a PVD process, since an overhang configuration causing the reduction of the amount of atoms to be deposited, particularly in a via-hole having a smaller opening size, such as 0.5 micrometers or less, is eliminated, a thin and continuous conductive film having improved morphology can totally be formed over a substrate.

Figure 9:
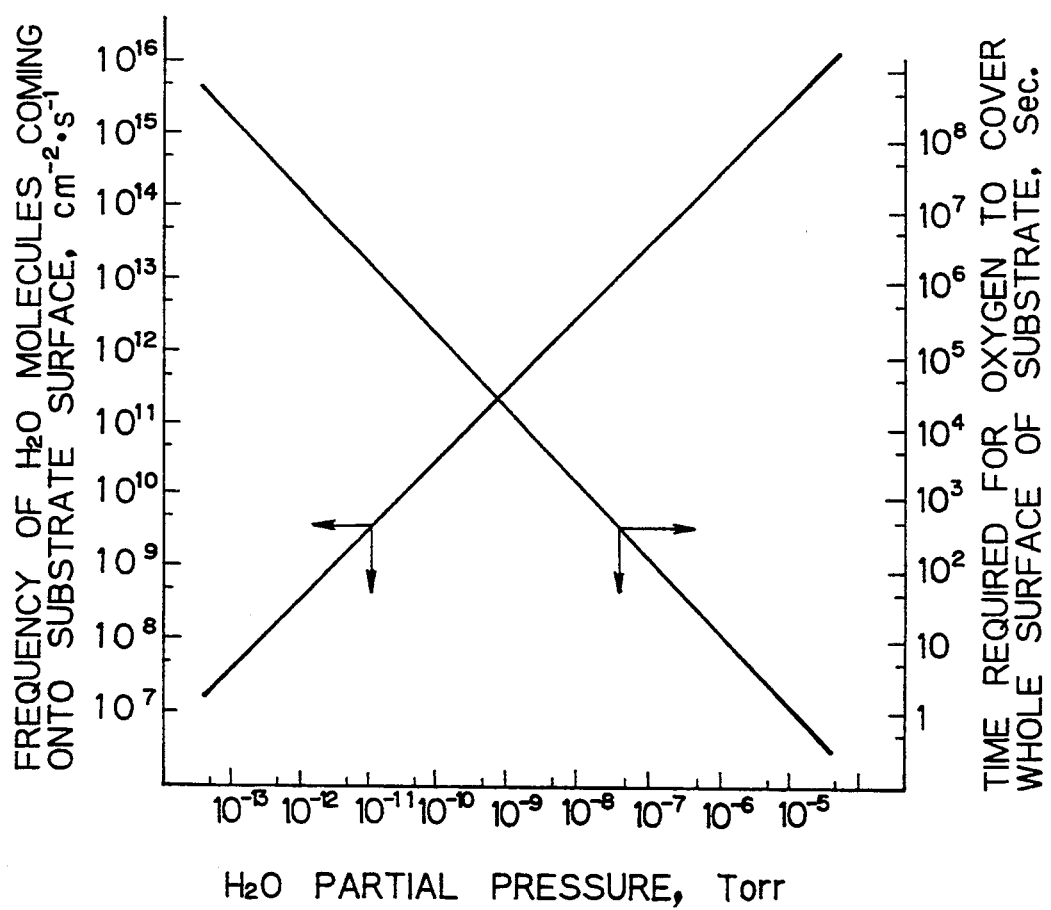
FIG. 9 diagrammatically shows the frequency of $H_2O$ molecules coming onto a substrate surface and the time required for dissociated oxygen atoms to cover the whole surface of the substrate versus $H_2O$ partial pressure.

Finally, FIG. 9 shows the calculated time required for the whole surface of a substrate to be covered by atoms of a residual gas. The calculation was performed assuming that oxygen and hydrogen atoms of $H_2O$ molecule of a major residual gas ingredient are dissociated, and only the oxygen atoms are adsorbed on the surface of a substrate. Further, the sticking coefficient of 1 was postulated, i.e., it was postulated that all of the oxygen atoms reaching the substrate surface are adsorbed thereon. Based on the covalent bond radius of oxygen of 0.66 angstroms, it was calculated that the amount of oxygen atoms required to cover a unit area of 1 square centimeter is $5.75 \times 10^{-15}$. In a vacuum of $1 \times 10^{-6}$ Torr, for example, the partial pressure of residual $H_2O$ gas is estimated to be of the order of $1 \times 10$ Torr. Under this partial pressure, the frequency of $H_2O$ molecules coming onto the substrate surface will be $4.76 \times 10$ per square centimeter per second ($cm^{-2} \cdot s^{-1}$), and the time required for oxygen atoms to cover the whole surface of the substrate is $1.21 \times 10$ seconds, about 2 minutes. Consequently, the whole surface of the substrate is covered by oxygen atoms when exposure, which is defined by the product of partial pressure and time, is 12.1L (langmuirs) (langmuir=$10^{-6}$ Torr·s). The time of period reaching this exposure becomes long, when the frequency of $H_2O$ molecules coming onto the substrate is lowered with the reduction of partial pressure of residual gas.

Referring to FIG. 9, at a partial pressure of $H_2O$ of $1 \times 10^{-10}$ Torr (a total pressure being above $1 \times 10^{-9}$ Torr), the whole surface of a substrate will be covered by oxygen atoms in 1.4 hours. Thus, when an experiment extending for a several hours is required to be carried out by excluding the effect of a residual oxygen, a much lower total pressure of the order of $10^{-11}$ Torr would be required. This relationship is true of a substrate on which a conductive material is partially or totally deposited. In practice, annealing of the deposited material would favorably be carried out in a vacuum containing an oxidative gas of partial pressure of not greater than $10^{-9}$ Torr, as described hereinbefore.

The invention has been described above using aluminum and via-holes by way of example. In general, metallic materials other than aluminum that are used in an interconnection layer in a semiconductor device may be used as a conductive material in the invention, such as copper, titanium, tungsten, tantalum, molybdenum, gold, and platinum, and the conductive material can be deposited on a substrate having not only via-holes, as in the above Examples, but also uneven surfaces resulting from uneven underlying layers. Thus, a person with ordinary skill in the art may make any change, modification, or variation in the described embodiments without departing from the spirit and scope of the invention.

I claim:

1. A method of forming a thin and continuous film of a conductive material on a substrate by a physical vapor deposition process, the method comprising:
   (a) placing said substrate into a vacuum chamber of a physical vapor deposition system, and creating a vacuum in the chamber,
   (b) introducing a nucleus forming gas into the vacuum chamber and allowing the atoms of the gas to be adsorbed on the surface of the substrate, while holding the substrate at a temperature not exceeding room temperature,
   (c) stopping the introduction of the gas and re-creating a vacuum in the chamber, and carrying out a first physical vapor deposition of a conductive material at a temperature of the substrate not exceeding room temperature until stable nuclei of the conductive material are formed on the substrate, and
   (d) heating the substrate and carrying out a second physical vapor deposition of the conductive material, wherein the temperature at which the substrate is heated is a substantially higher temperature than room temperature, thereby forming a thin and continuous film of the conductive material on the substrate.

2. The method of claim 1, wherein the temperature of the substrate in steps (b) and (c) is not greater than 20° C.

3. The method of claim 1, wherein the temperature of the substrate in step (d) is not less than 80° C.

4. The method of claim 1, wherein the vacuum chamber is at a pressure less than $10^{-8}$ Torr in step (a).

5. The method of claim 1, wherein the first and second physical vapor depositions are effected in a vacuum of less than $10^{-7}$ Torr.

6. The method of claim 1, wherein the first and second physical vapor deposition are effected in a vacuum in which a non-nucleus forming gas is included.

7. The method of claim 1, wherein one of the first and second physical vapor depositions is effected in a vacuum of less than $10^{-7}$ Torr and the other is effected in a vacuum in which a non-nucleus forming gas is included.

8. The method of claim 1, wherein the nucleus forming gas is selected from the group consisting of oxygen, water, and carbon monoxide.

9. The method of claim 6, wherein the non-nucleus forming gas is selected from the group consisting of argon, krypton, xenon, helium, and neon.

10. The method of claim 7, wherein the non-nucleus forming gas is selected from the group consisting of argon, krypton, xenon, helium, and neon.

11. The method of claim 1, wherein the conductive material is selected from the group consisting of aluminum, copper, tungsten, titanium, tantalum, molybdenum, gold, and platinum.

12. The method of claim 1, further comprising, prior to step (b), baking the substrate in a high vacuum atmosphere, thereby degassing the substrate.

13. A method of forming a thin and continuous film of a conductive material on a substrate by a physical vapor deposition process, the method comprising:
  (a) placing said substrate into a vacuum chamber of a physical vapor deposition system, and creating a vacuum in the chamber having a partial pressure of a nucleus forming gas of less than $10^{-8}$ Torr,
  (b) carrying out a first physical vapor deposition of a conductive material at a substrate temperature not exceeding room temperature, until stable nuclei of the conductive material are formed on the substrate, and
  (c) heating the substrate and carrying out a second physical vapor deposition of the conductive material, wherein the temperature to which the substrate is heated is a substantially higher temperature than room temperature, while maintaining the vacuum in the chamber, thereby forming a thin and continuous film of the conductive material on the substrate.

14. The method of claim 13, wherein the temperature of the substrate in step (b) is not greater than 20° C.

15. The method of claim 13, wherein the temperature of the substrate in step (c) is not less than 80° C.

16. The method of claim 13, wherein the nucleus forming gas is selected from the group consisting of oxygen, water, and carbon monoxide.

17. The method of claim 13, wherein the first and second physical vapor depositions are carried out in a vacuum in which a non-nucleus forming gas is present.

18. The method of claim 17, wherein the non-nucleus forming gas is selected from the group consisting of helium, neon, argon, krypton, and xenon.

19. A method of forming a thin and continuous film of a conductive material, by a PVD process, on a substrate having an insulating film which is provided with via-holes, the method comprising:
  (a) placing said substrate into a vacuum chamber of a physical vapor deposition system, and creating a vacuum therein;
  (b) depositing a conductive material onto the substrate at a temperature;
  (c) interrupting the deposition of the conductive material;
  (d) annealing the deposited conductive material with the substrate at a higher temperature than the temperature for the deposition thereof and under a vacuum condition; and
  (e) re-depositing the conductive material onto the annealed substrate.

20. The method of claim 19, wherein the deposition of the conductive material is carried out at a temperature less than the mass-transportation temperature of the material under the deposition conditions.

21. The method of claim 20, wherein the annealing of the deposited material is carried out at a temperature equal to or greater than the mass-transportation temperature of the material under the deposition conditions.

22. The method of claim 19, wherein the conductive material is deposited on the substrate by evaporation.

23. The method of claim 22, wherein the deposition is carried out at a vacuum pressure of less than $5 \times 10^{-7}$ Torr.

24. The method of claim 19, wherein the annealing is effected before the surface of the deposited material is totally covered by a process atmosphere containing an oxidative gas.

25. The method of claim 19, wherein the annealing is carried out in a vacuum containing an oxidative gas of partial pressure of not greater than $10^{-9}$ Torr.

26. The method of claim 19, wherein the conductive material is selected from the group consisting of aluminum, copper, tungsten, titanium, tantalum, molybdenum, gold, and platinum.

* * * * *